United States Patent [19]
Iso

[11] Patent Number: 6,087,625
[45] Date of Patent: Jul. 11, 2000

[54] LASER MACHINING APPARATUS

[75] Inventor: Keiji Iso, Hiratsuka, Japan

[73] Assignee: Sumitomo Heavy Industries, Ltd., Tokyo, Japan

[21] Appl. No.: 09/042,949

[22] Filed: Mar. 17, 1998

[30] Foreign Application Priority Data

Mar. 21, 1997 [JP] Japan ................................ 9-068040
Jun. 3, 1997 [JP] Japan ................................ 9-145013

[51] Int. Cl.$^7$ .................................................. B23K 26/00
[52] U.S. Cl. ............................ 219/121.8; 219/121.78; 219/121.6; 219/121.67; 219/121.83; 219/121.76; 219/121.82; 219/121.65
[58] Field of Search ........................... 219/121.8, 121.78, 219/121.6, 121.67, 121.83, 121.76, 121.82, 121.65; 264/1.77, 400, 482

[56] References Cited

U.S. PATENT DOCUMENTS

| | | |
|---|---|---|
| 3,925,785 | 12/1975 | Firtion et al. ............................. 346/1 |
| 4,504,727 | 3/1985 | Melcher et al. .................. 219/121 LB |
| 5,227,607 | 7/1993 | Ishiyama ............................ 219/121.68 |
| 5,293,389 | 3/1994 | Yano et al. ............................... 372/30 |
| 5,498,851 | 3/1996 | Hayashi et al. ....................... 219/121.7 |
| 5,786,560 | 7/1998 | Tatah et al. ......................... 219/121.77 |

*Primary Examiner*—Patrick Ryan
*Assistant Examiner*—M. Alexandra Elve
*Attorney, Agent, or Firm*—Burns, Doane, Swecker & Mathis, LLP

[57] ABSTRACT

A pulsed laser beam from a laser oscillator 10 is split into two by a beam splitter 13. The split laser beams are radiated by X-Y scanners 14 and 16 through working lenses 17 and 18 onto a work 20. Additionally on the work, the laser beams are swung in X-axis and Y-axis directions. These X-Y scanners simultaneously process a plurality of process regions which are divided and set on the work.

5 Claims, 8 Drawing Sheets

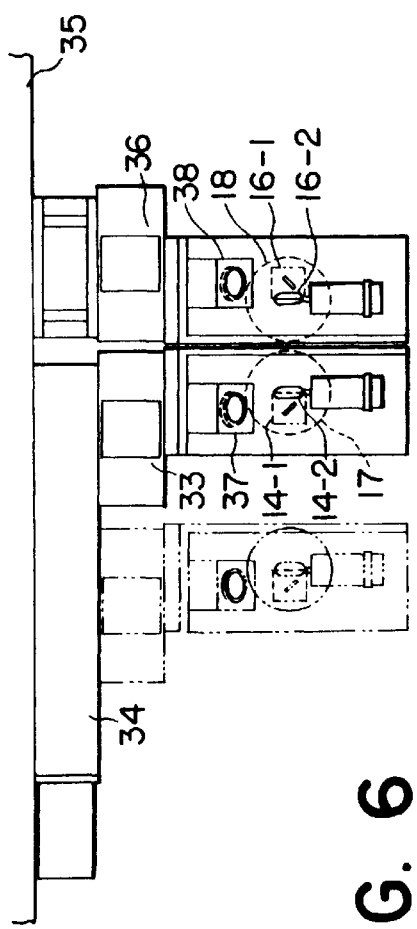
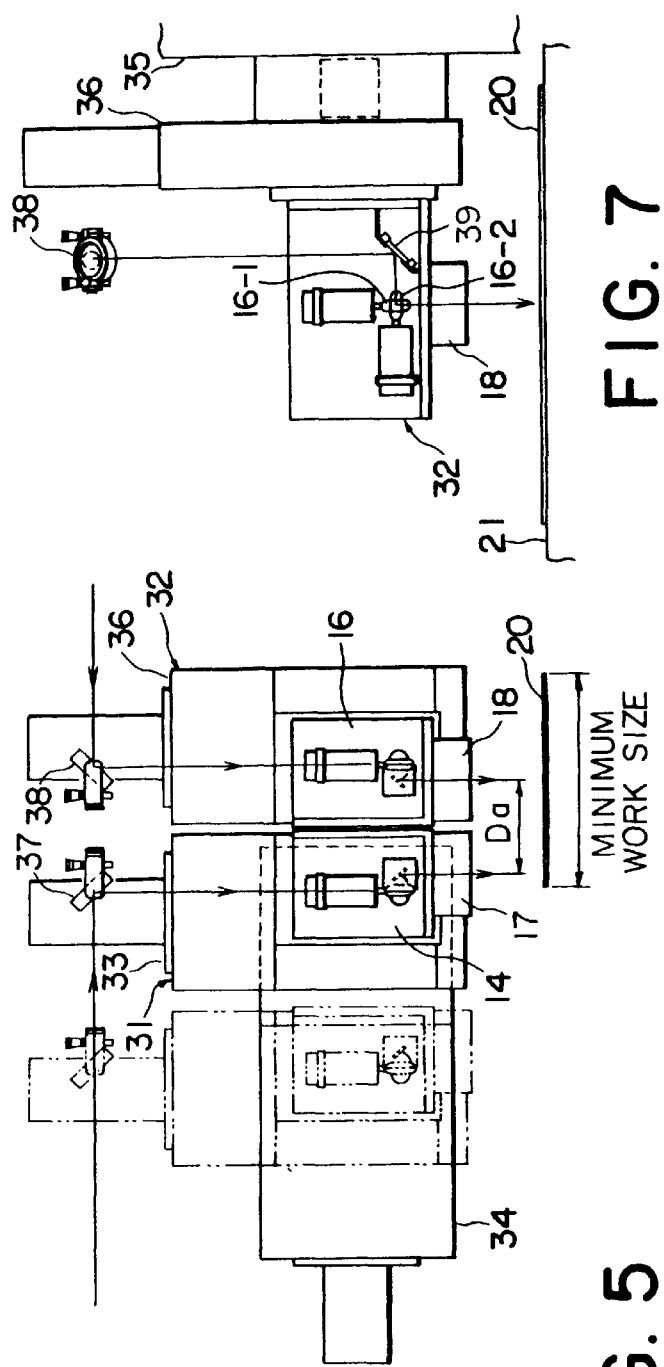
FIG. 7
FIG. 6
FIG. 5

LASER MACHINING APPARATUS

BACKGROUND OF THE INVENTION

The present invention relates to a laser machining apparatus, particularly to a laser machining apparatus which is designed mainly for a hole making process and which is improved to enhance its processing speed.

In electronic devices such as a cellular phone, a digital video camera, a personal computer and the like, a high-density multilayered wiring board is used. The high-density multilayered wiring board is constituted of plural layer boards. During the manufacture of the high-density multilayered wiring board, in order to pass a signal conductor line between an inner-layer board and an outer-layer board, a passing hole called a via hole needs to be made in each layer board. Especially, to attain a high density of wiring, a diameter of the via hole requires to be minimized.

The high-density multilayered wiring board is manufactured by taking multiple pieces from a single mother board. Specifically, on the mother board, a plurality of process regions with predetermined sizes for processing the high-density multilayered wiring board are set in a matrix manner. Then, holes are made in a plurality of predetermined positions in each predetermined-sized process region. The mother board is called a work.

As an apparatus for making micro-diameter holes, recently, a laser machining apparatus has been mostly used. The laser machining apparatus designed mainly for the hole making process is usually provided with an X-Y stage. On the X-Y stage, the work is mounted and can be horizontally moved in X-axis and Y-axis directions. In the laser machining apparatus, by moving the work on the X-Y stage, a position to be processed with a pulsed laser beam is changed. For this purpose, the positioning by means of the X-Y stage takes time. A processing speed is restricted.

SUMMARY OF THE INVENTION

Therefore, an object of the invention is to provide a laser machining apparatus which can largely enhance a processing speed.

To attain this and other objects, the present invention provides a laser machining apparatus which includes a laser oscillator for generating a pulsed laser beam, a splitting means for splitting the laser beam into a plurality of split beams, and a plurality of X-Y scanners for swinging and radiating the split laser beams in an X-axis direction and a Y-axis direction relative to a work face. A plurality of process regions which are divided and set on a work are processed simultaneously by the plurality of X-Y scanners.

BRIEF DESCRIPTION OF THE DRAWINGS:

FIG. 5 is a front view of a laser machining apparatus according to a first embodiment of the present invention;

FIG. 6 is a plan view of the laser machining apparatus shown in FIG. 5;

FIG. 7 is a side view of the laser machining apparatus shown in FIG. 5;

DESCRIPTION OF THE PREFERRED EMBODIMENTS

Figure 1:
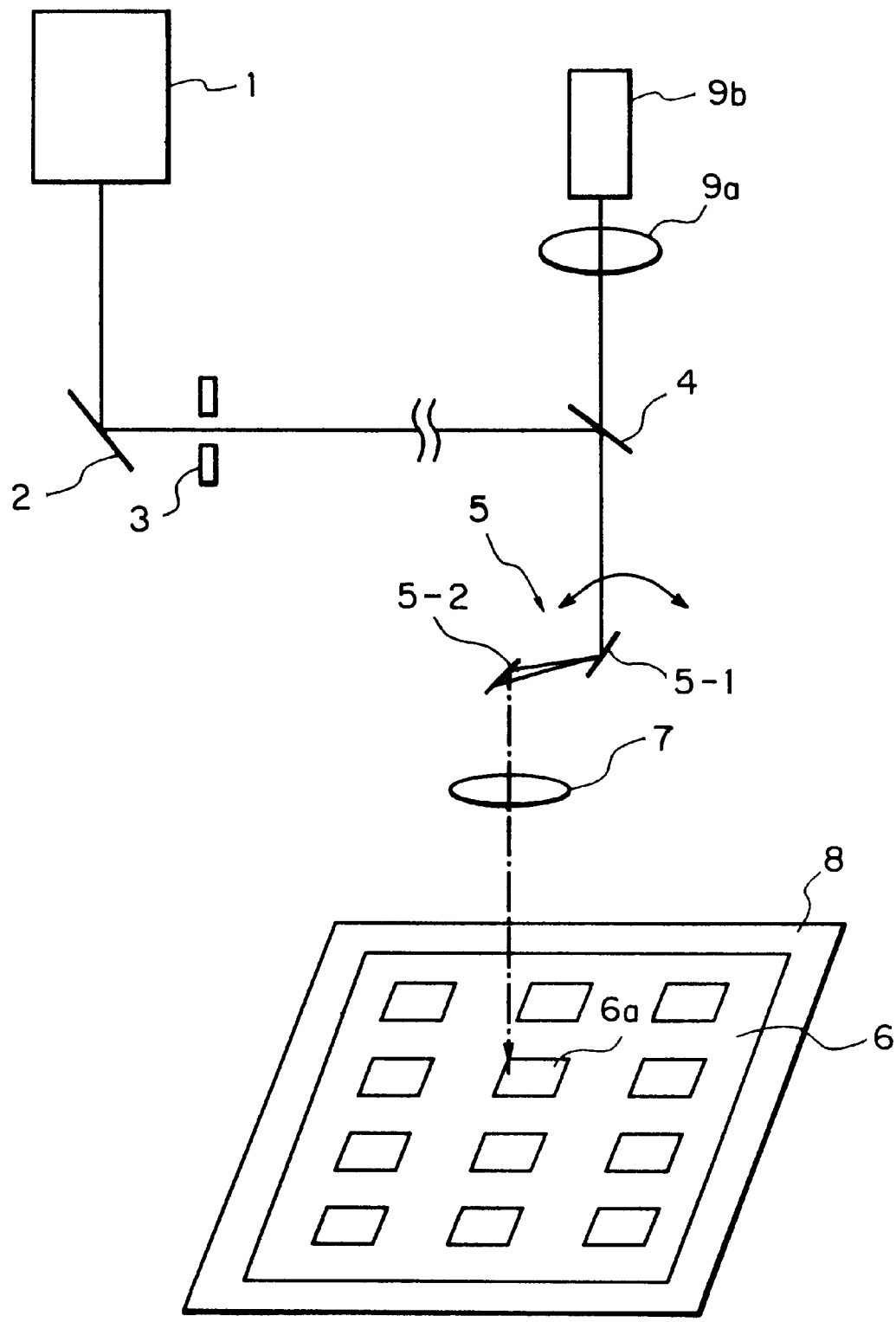
FIG. 1 is a diagrammatic view showing a constitution of a conventional laser machining apparatus which uses a galvano-scanner.

To facilitate understanding of the present invention, a conventional laser machining apparatus using a galvano-scanner will be described with reference to FIG. 1. In FIG. 1, a pulsed laser beam emitted from a laser oscillator 1 is guided via a reflecting mirror 2 into a mask 3. The pulsed laser beam passed through the mask 3 is reflected downward by a reflecting mirror 4. The laser beam reflected by the reflecting mirror 4 is swung in X-axis and Y-axis directions on a work 6 by an X-Y scanner 5. The X-Y scanner 5 includes a first galvano-mirror 5-1 and a second galvano-mirror 5-2 as described later in detail. The galvano-mirror can respond at an operation frequency of 200 to 800 Hz. The laser beam swung by the X-Y scanner 5 is radiated through a working lens 7 onto process regions 6a set on the work 6. The working lens 7 is generally called an fθ lens.

Additionally, the work 6 is mounted on an X-Y stage 8. Here, drawing and description of a drive system in the X-Y stage 8 are omitted. Also, an alignment system is provided above the reflecting mirror 4 in order to carry out positioning of the work 6 by the use of a lens 9a and a CCD camera 9b. The description of the alignment system is also omitted.

Figure 2:
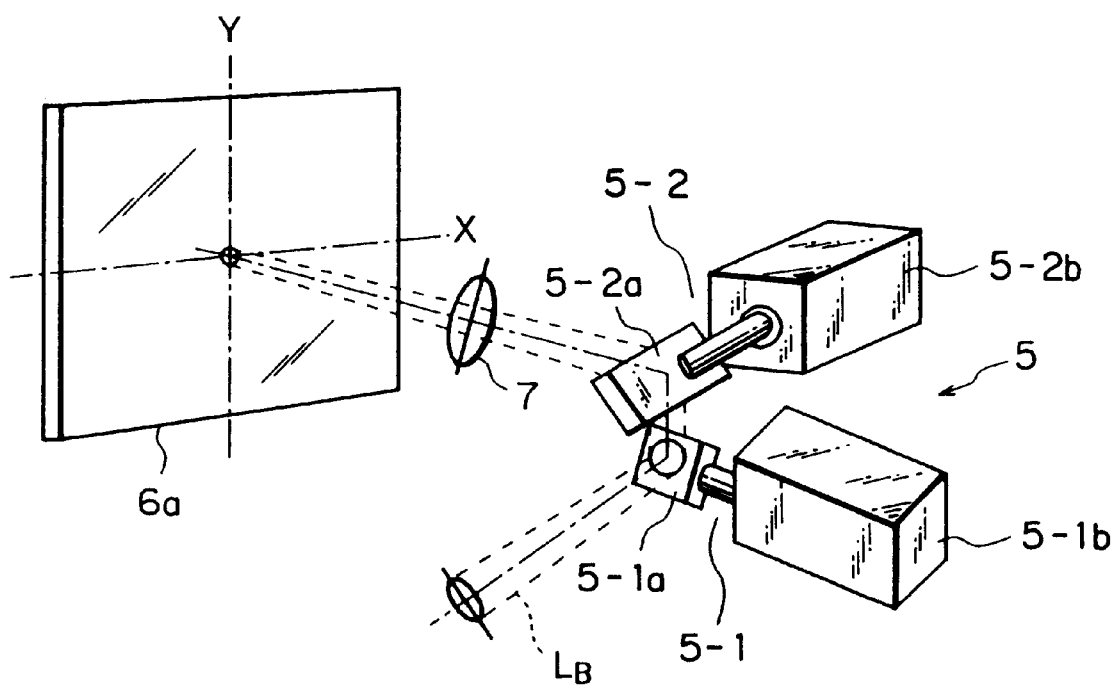
FIG. 2 is a diagrammatic view showing a constitution of an X-Y scanner.

The X-Y scanner 5 will be described with reference to FIG. 2. The X-Y scanner 5 is called a galvano-scanner which is constituted by combining the first and the second galvano mirrors 5-1 and 5-2. As is well known, the first galvano-mirror 5-1 is constituted of a reflecting mirror 5-1a and a drive mechanism 5-1b for rotating the reflecting mirror 5-1a. In the same manner, the second galvano-mirror 5-2 is constituted of a reflecting mirror 5-2a and a drive mechanism 5-2b for rotating the reflecting mirror 5-2a. By independently rotating the two reflecting mirrors 5-1a and 5-2a according to an operation principle of a galvano-meter, laser beams LB can be continuously radiated through the working lens 7 to desired plural positions on the work 6.

In the laser machining apparatus, by swinging the laser beam relative to the process region 6a of the work 6, processing is performed. When the processing of the process region 6a is finished, the work 6 is moved by the X-Y stage 8 in such a manner that the next process region is positioned right under the working lens 7.

By a combination of the X-Y scanner 5 and the X-Y stage 8, a processing speed of the laser machining apparatus can be enhanced as compared with the laser machining apparatus described before.

For a size of the work 6, the work 6 is a square having each side of about 300 to 600 mm. To take multiple pieces from the work 6, usually ten or more process regions 6a are predetermined in a matrix manner. On the other hand, a region which can be scanned by the galvano-mirror is usually a square having each side of about 50 mm. Therefore, even the laser machining apparatus requires a considerable period of time for processing all the process regions of a single work.

A basic constitution of a laser machining apparatus according to the present invention will be described with reference to FIG. 3.

Figure 3:
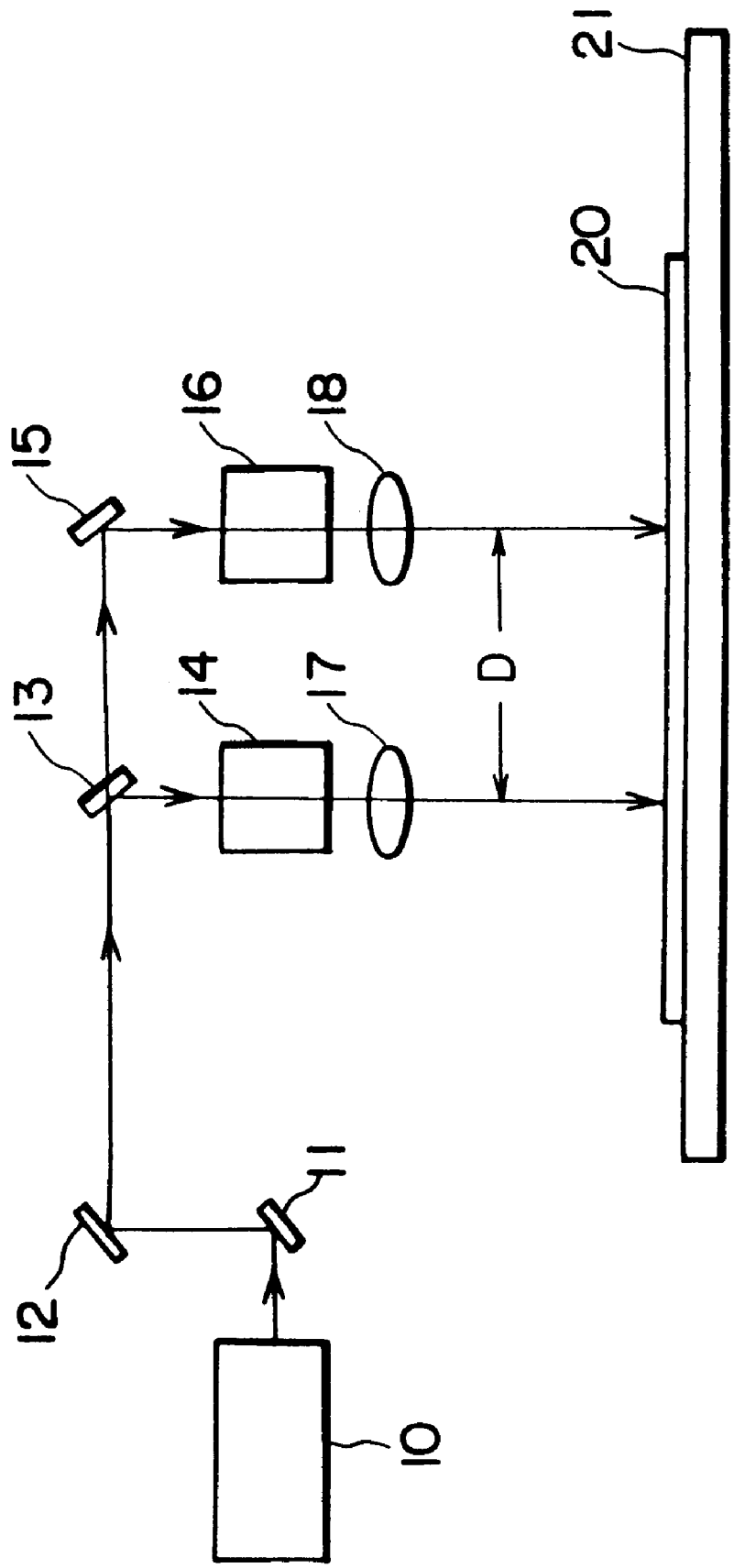
FIG. 3 shows a basic constitution of a laser machining apparatus according to the present invention.

In FIG. 3, a pulsed laser beam from a laser oscillator 10 is guided via reflecting mirrors 11 and 12 to a beam splitter 13. Additionally, a mask (not shown) is disposed before the beam splitter 13 in the same manner as shown in FIG. 1. The laser beam is thus formed in a predetermined beam size. The beam splitter 13 splits the incident laser beam into two. Instead of the beam splitter 13, for example, a prism, a half mirror or another optical element may be used. One of the split laser beams is introduced to a first X-Y scanner 14. Another split laser beam is guided via a reflecting mirror 15 into a second X-Y scanner 16. The X-Y scanner has a structure the same as the structure shown in FIG. 2. The laser beams emitted from the first and the second X-Y scanners 14 and 16 are radiated through working lenses 17 and 18 onto a work 20. The work 20 is mounted on an X-Y stage 21 which can move horizontally in X-axis and Y-axis directions.

Additionally, the working lens 17 or 18 is used for focusing laser beams in a known manner, and is also called an fθ lens. Each of the working lenses 17 and 18 is practically constituted of a combination of a plurality of convex lenses and concave lenses which is contained in a cylindrical housing. The combination is called as an fθ lens assembly. In FIG. 3, for the sake of convenience, the fθ lens assembly is represented by a single working lens. Additionally, the aforementioned constitutional elements are controlled by a control device (not shown). The control device is a data input device for input of necessary processing conditions as numerical data.

As the laser oscillator 10, a $CO_2$ gas laser oscillator, a YAG higher harmonic wave laser oscillator, an EXCIMER laser oscillator or the like can be used. From the laser oscillator, an output of several tens to hundreds of watts can be obtained. However, a necessary output power for making holes in a printed board or another resin plate is usually ten watts or less. Therefore, even when the laser beam from the laser oscillator 10 is split into two, there is no problem with the processing.

Figure 4:
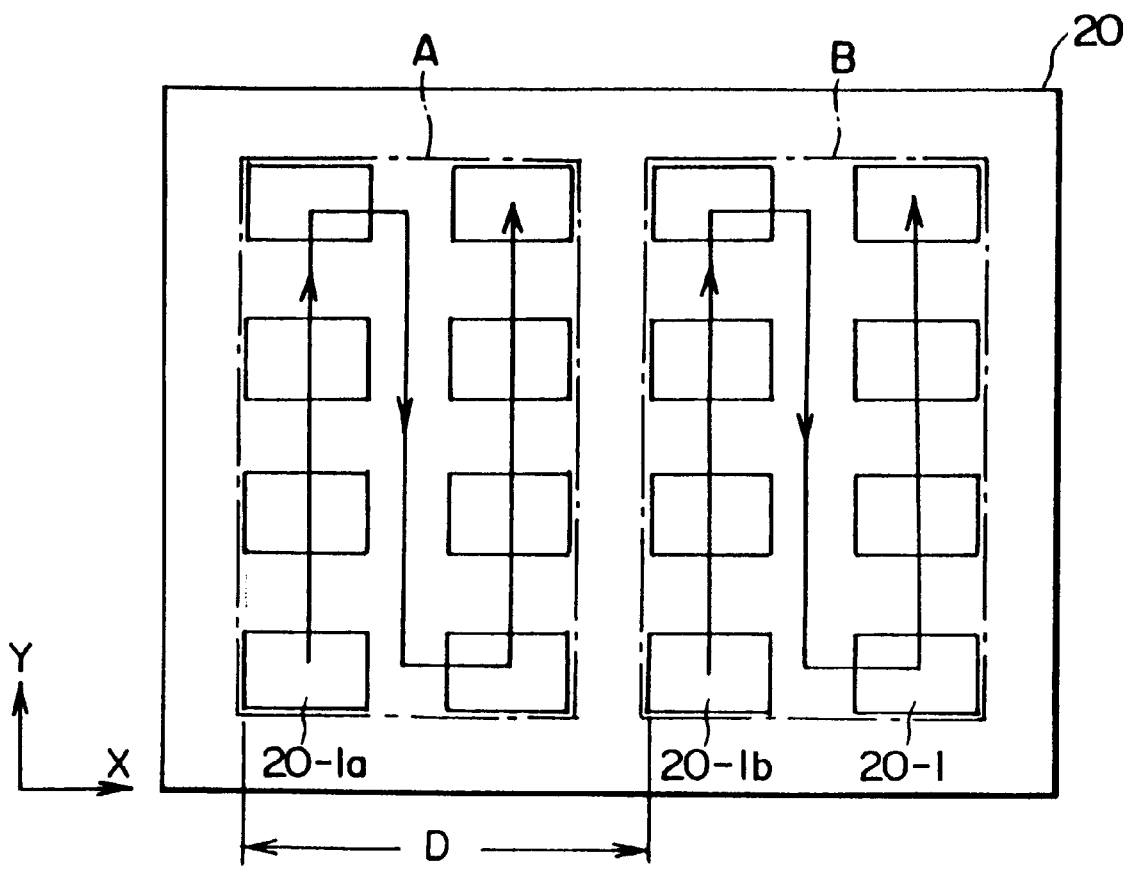
FIG. 4 is an explanatory view showing work process regions which are processed by the laser machining apparatus of the present invention.

FIG. 4 shows a plurality of process regions predetermined on the work 20 from which multiple pieces are to be taken. Here, sixteen (4×4=16) process regions 20-1 are set in a matrix manner. Each process region 20-1 has the same size as a size of a board as a final product. This is determined by a size of an electronic device to which the final product is actually mounted. In either case, when the work 20 shown in FIG. 4 is laser-processed to make holes therein, a half region A is processed by the first X-Y scanner 14 and the working lens 17. Another half region B is processed by the second X-Y scanner 16 and the working lens 18. For example, when the first X-Y scanner 14 and the working lens 17 start processing from a left corner as seen in FIG. 4 of a process region 20-1a, the second X-Y scanner 16 and the working lens 18 also start processing from a left corner as seen in FIG. 4 of a process region 20-1b. As a result, when processing is finished, the same process patterns can be obtained. Subsequently, by moving the X-Y stage 21 in the X-axis and the Y-axis directions, apparently, the laser processing in the same process pattern by a combination of the X-Y scanner and the working lens is performed in order as shown by arrow lines in FIG. 4. In this case, a distance D is kept between center points of the working lenses 17 and 18.

Additionally, the size of the work 20 varies with the board size of the final product. The work 20 has each side of 300 to 600 mm. Therefore, the distance D between the central points of the working lenses 17 and 18 needs to be changed in a range 150<D<300. For this purpose, at least one of the combination of the first X-Y scanner 14 and the working lens 17 and the combination of the second X-Y scanner 16 and the working lens 18 needs to be movable in a horizontal direction. This respect will be described later.

The work 20 is set on a plate on the X-Y stage 21 manually or with an automatic work replacement device. The plate (not shown) is provided for holding the work in vacuum. Further, in the same manner as in FIG. 1, an alignment system constituted of an image processing device (not shown) is mounted above the beam splitter 13 and the reflecting mirror 15 shown in FIG. 3. In the alignment system, after a reference position mark (usually, referred to as an alignment mark) placed beforehand on the work 20 is recognized, a set position of the work 20 is detected with a precision of 10 $\mu$m or less. The process region 20-1 is thus determined. In this case, an operator inputs beforehand the size, interval or the like of the process region 20-1 via the data input device. The control device determines an optimum distance D based on the input data. Based on the distance D, the combination of the first X-Y scanner 14 and the working lens 17 and the combination of the second X-Y scanner 16 and the working lens 18 are arranged, while the process region 20-1 is set.

The laser machining apparatus according to a first embodiment of the present invention will be described with reference to FIGS. 5 to 7. In FIG. 5, the laser machining apparatus has a first scan system 31 in which the first X-Y scanner 14 and the working lens 17 are integrally mounted and a second scan system 32 in which the second X-Y scanner 16 and the working lens 18 are integrally mounted. The first X-Y scanner 14 has first and second galvano-mirrors 14-1 and 14-2. The second X-Y scanner 16 has first and second galvano-mirrors 16-1 and 16-2. The first scan system 31 is mounted on a first Z-axis stage 33 which can be operated in a Z-axis direction (perpendicularly to the work 20). The first Z-axis stage 33 is mounted on an L-axis stage 34 which can be operated in an L-axis direction parallel with a face of the work 20. The L-axis stage 34 is attached to a base frame 35. On the other hand, the second scan system 32 is mounted on a second Z-axis stage 36 which can be operated in the Z-axis direction. The second Z-axis stage 36 is attached to the base frame 35. Therefore, the first scan system 31 can be moved in the Z-axis and the L-axis directions, and the second scan system 32 can be moved only in the Z-axis direction.

The laser machining apparatus of the embodiment is different from the basic constitution of FIG. 3 in that the first and the second scan systems 31 and 32 are arranged in such a manner that the first and the second X-Y scanners 14 and 16 are in symmetry. A distance Da between the central points of the first and the second working lenses 17 and 18 are thus minimized. Conversely, in FIG. 5, for example, when the first and the second galvano-mirrors 16-1 and 16-2 in the second X-Y scanner 16 are oriented in the same direction as the first and the second galvano-mirrors 14-1 and 14-2 in the first X-Y scanner 14, then optical axes of the first and the second galvano-mirrors 16-1 and 16-2 are deviated toward the right as seen in FIG. 5. In this case, the distance Da has to be increased as much.

Here, reflecting mirrors 37 and 38 for receiving split laser beams are disposed in opposite directions for receiving the split laser beams from the opposite directions. The laser beam reflected by the reflecting mirror 38 is guided through a reflecting mirror 39 into the second X-Y scanner 16. In the same manner, the laser beam from the reflecting mirror 37 is guided through a reflecting mirror (not shown) into the first X-Y scanner 14.

In the structure, processing is also performed symmetrically by the first and the second scan systems 31 and 32. For example, when the first scan system 31 starts processing from a left corner as seen in FIG. 4 of the process region 20-1a, the second scan system 32 starts processing from a right corner as seen in FIG. 4 of the process region 20-1b. However, when the processing is finished, the same process patterns can be obtained. During the processing, a scanning order of the second X-Y scanner 16 may be the reverse of a scanning order of the first X-Y scanner 14. For this purpose, a scanning operation signal supplied to the second X-Y scanner 16 may be the reverse of a scanning operation signal supplied to the first X-Y scanner 14. Of course, this is performed in the control device. Additionally, the process region is moved in order by operating and controlling the X-Y stage 21 in the same manner as in FIG. 4.

Also in the embodiment, in accordance with the size of the work and the size of the process region, the first scan system 31 is moved in the L-axis direction to change the distance Da between the center points of the first and the second working lenses 17 and 18. Additionally, the second scan system 32 may be moved in a direction reverse to the movement direction of the first scan system 31 by an L-axis stage similar to the L-axis stage 34.

As aforementioned, the first and the second X-Y scanners 14 and 16 are operated and controlled by the control device. After the laser processing of a certain process region is finished, the X-Y stage 21 is also operated by the control device in order to move the work 20 and shift to the next process region. The X-Y stage 21 is moved horizontally in the X-axis and the Y-axis directions.

The process position relative to the process region 20-1 is determined by a command value of a rotation angle which is given from the control device to each X-Y scanner. Not only regularly arranged holes but also irregularly arranged hole can be made.

The laser machining apparatus can perform the processing at a processing speed which is twice as high as the processing speed of the laser machining apparatus shown in FIG. 1.

Figure 8:
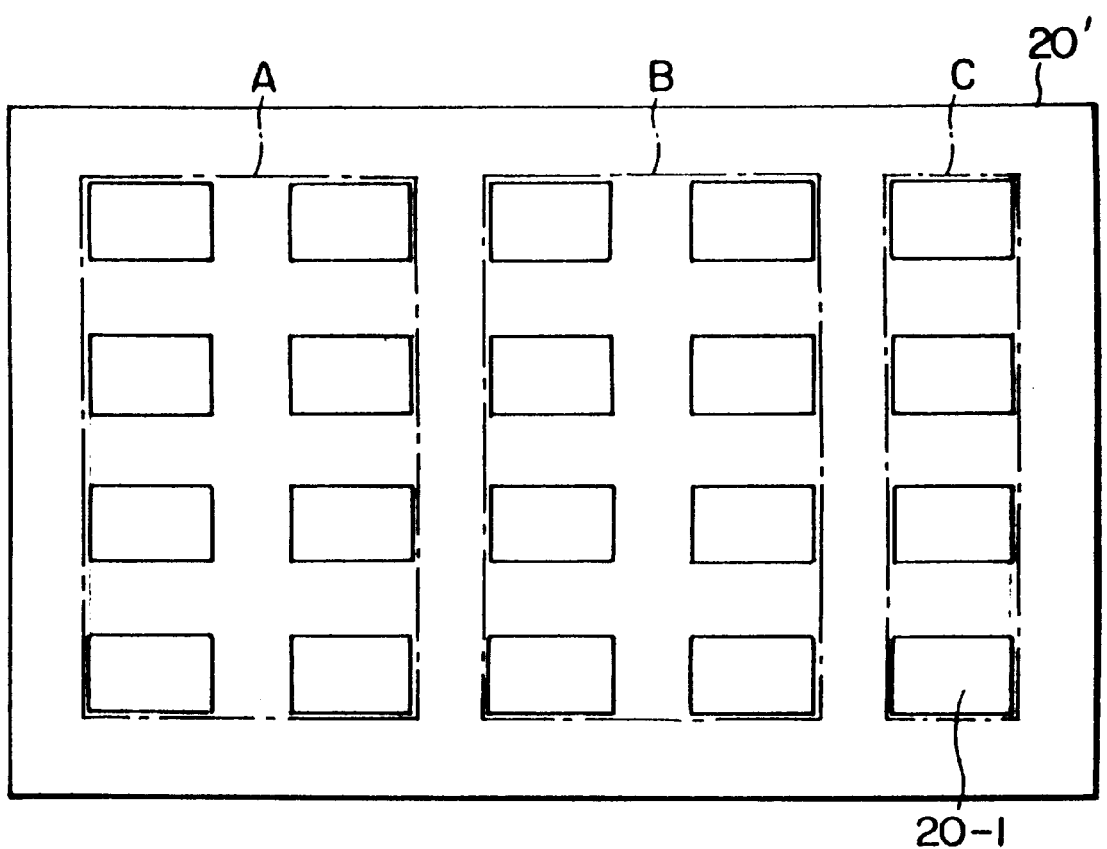
FIG. 8 is an explanatory view showing another example of a work which has process regions to be processed by the laser machining apparatus according to the present invention.

As shown in FIG. 8, when the total number of the process regions 20-1 cannot be divided into two, a work 20' is processed as follows: first, divided regions A and B which have the same numbers of process regions 20-1 are processed simultaneously. For a remaining region C, for example, by disposing a beam shutter in a path of the laser beam from the first scan system 31, the laser beam is shut off. Then, the region C is processed by the second scan system 32.

Figure 9:
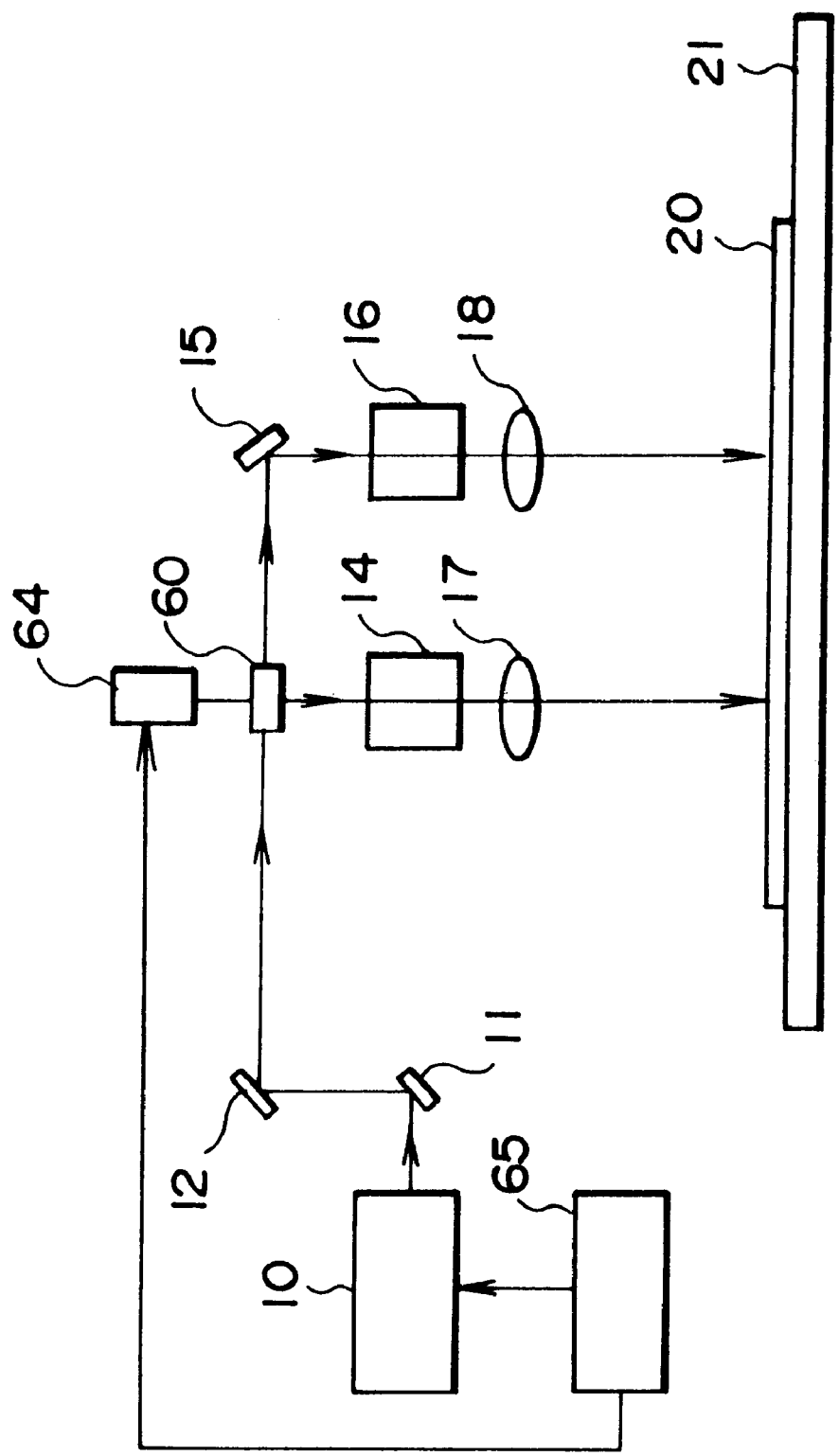
FIG. 9 shows a basic constitution of a laser machining apparatus according to a second embodiment of the present invention.
Figure 10:
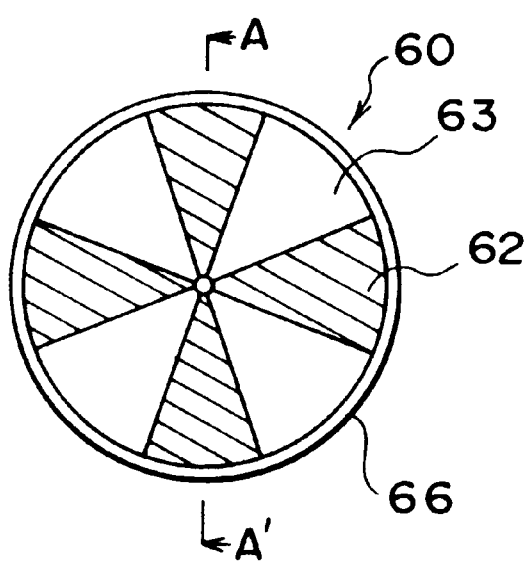
FIG. 10 is a front view showing a constitution of a rotary body in a beam chopper for use in the laser machining apparatus shown in FIG. 9.
Figure 11:
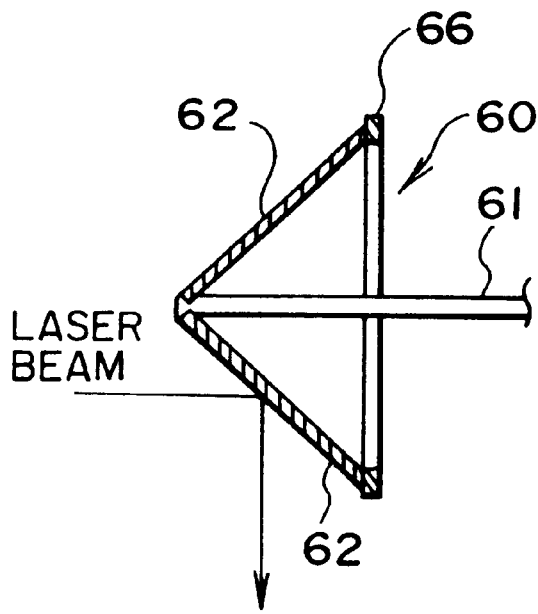
FIG. 11 is a sectional view along a line A–A' in FIG. 10.
Figure 12:
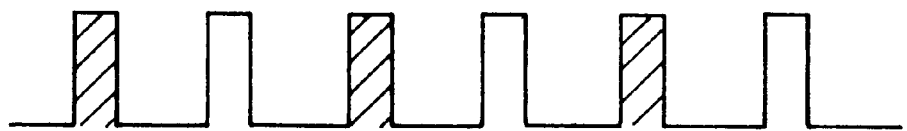
FIG. 12 is an explanatory view showing that a pulsed laser beam is split by the beam chopper shown in FIG. 10.

A laser machining apparatus according to a second embodiment of the present invention will be described with reference to FIGS. 9 and 12. In FIG. 9, the same portion as in FIG. 3 is denoted with same reference numerals, and the description thereof is omitted. In the second embodiment, to split the laser beam, instead of the optical element as described above, a mechanical splitter or so-called a beam chopper is provided. As shown in FIGS. 10 and 11, the beam chopper includes a rotation body 60. The rotation body 60 is constituted by alternately arranging laser beam reflecting mirrors 62 and penetrating portions 63 in equal areas around a rotation axis 61. The beam chopper further includes a drive mechanism 64 including a motor for rotating and operating the rotation body 60 and a synchronous controller 65 for controlling the drive mechanism 64. The synchronous controller 65 controls the drive mechanism 64 in such a manner that the pulsed laser beam from the laser oscillator 10 is repeatedly reflected and penetrated. In the embodiment, the rotation body 60 is constituted by attaching four reflecting mirrors 62 to an annular frame 66 at an angle of 45 degrees relative to the incident direction of the laser beam.

The synchronous controller 65 transmits a trigger pulse to the laser oscillator 10 to determine an output timing of the pulsed laser beam. Synchronously with the output timing, the synchronous controller 65 controls a motor rotation speed of the drive mechanism 64 in such a manner that continuous pulsed laser beams are alternately reflected and penetrated. As a result, as shown in FIG. 12, the pulsed laser beams shown by slash lines are passed through the beam chopper to reach the reflecting mirror 15 (FIG. 9). The pulsed laser beams provided with no slash lines are reflected by the reflecting mirrors 62 to reach the first X-Y scanner 14 (FIG. 9).

When the beam chopper is used, different from the splitter constituted of the optical element shown in FIG. 3, an energy density per pulse of the laser beam on a process face fails to decrease. In other words, in the embodiment of FIG. 3, for example, when the beam splitter 13 with a 50% penetration is used, the energy density per pulse of the laser beam on the process face is reduced to half. Therefore, according to the embodiment, the present invention can be applied to a laser oscillator which has a low pulse energy. For example, when the via holes are made in the printed board, t ser energy density on the process face is preferably $10J/cm^2$ or more, which varies with a material of the printed board. However, in the case of the laser oscillator with a low pulse energy, it is difficult to make the via holes in the printed board through the splitting by means of the optical elements because the energy density is decreased. However, by using the beam chopper according to the embodiment, the via holes can be made with a desired energy density.

In the above, two embodiments of the invention have been described. However, the present invention is not restricted to the embodiments and can be modified variously. For example, two sets of the X-Y scanner and the working lens are used in the embodiment. However, three or more sets of the X-Y scanner and the working lens may be used. Additionally, not only the printed board but also another material can be holed or processed.

What is claimed is:

1. A laser machining apparatus which includes:

a laser oscillator for generating a pulsed laser beam;

splitting means for splitting said laser beam into a plurality of split laser beams; and a plurality of X-Y scanners which swing and radiate the split laser beams in an X-axis direction and a Y-axis direction, respectively, relative to a face of a work, and wherein:

a plurality of process regions which are divided and set on said work are processed simultaneously by said split laser beams, respectively.

2. The laser machining apparatus as claimed in claim 1, wherein said apparatus is provided with two X-Y scanners and further includes a drive mechanism in which by moving horizontally at least one of said X-Y scanners, a distance between the two X-Y scanners being made variable.

3. The laser machining apparatus as claimed in claim 2, wherein said apparatus further includes an X-Y stage movable horizontally in the X-axis direction and the Y-axis direction as a stage on which said work is mounted.

4. The laser machining apparatus as claimed in claim 2, wherein said work is a printed board in which in order to take multiple boards having predetermined sizes from a single mother board, the process regions having said predetermined sizes are set on said mother board in a matrix manner, and said two X-Y scanners successively perform a hole making process in such a manner that the same process pattern can be obtained on each of said process regions with the predetermined sizes which are positioned symmetrically relative to an intermediate position between the X-Y scanners.

5. A laser machining apparatus which includes:

a laser oscillator for generating a pulsed laser beam;

a beam chopper for reflecting and penetrating said laser beam to produce a reflected laser beam and a penetrated laser beam; and a plurality of X-Y scanners which swing and radiate said reflected and said penetrated laser beams in an X-axis direction and a Y-axis direction, respectively, relative to a face of a work, and wherein:

a plurality of regions which are divided and set on said work are processed by said reflected and said penetrated laser beams, said beam chopper being provided with a rotation body constituted by alternatively arranging laser beam reflecting mirrors and penetrating portions in areas equally divided around a central axis, a drive mechanism for rotating and operating the rotation body and control means for controlling said drive mechanism in such a manner that said pulsed laser beam is alternately and repeatedly reflected and penetrated.

* * * * *